US008247686B2

(12) United States Patent
Feldman-Peabody et al.

(10) Patent No.: US 8,247,686 B2
(45) Date of Patent: *Aug. 21, 2012

(54) MULTI-LAYER N-TYPE STACK FOR CADMIUM TELLURIDE BASED THIN FILM PHOTOVOLTAIC DEVICES AND METHODS OF MAKING

(75) Inventors: Scott Daniel Feldman-Peabody, Golden, CO (US); Robert Dwayne Gossman, Aurora, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/149,423

(22) Filed: May 31, 2011

(65) Prior Publication Data

US 2012/0052620 A1 Mar. 1, 2012

(51) Int. Cl.
*H01L 31/0296* (2006.01)
*H01L 31/04* (2006.01)

(52) U.S. Cl. ............... 136/260; 438/86; 438/85; 438/95; 257/E31.015

(58) Field of Classification Search ............... 438/94, 438/95, 85, 86; 136/260; 257/E31.015
See application file for complete search history.

(56) References Cited

U.S. PATENT DOCUMENTS

| | | |
|---|---|---|
| 4,950,615 A | 8/1990 | Basol et al. |
| 5,261,968 A | 11/1993 | Jordan |
| 5,372,646 A | 12/1994 | Foote et al. |
| 5,474,939 A | 12/1995 | Pollock et al. |
| 5,922,142 A | 7/1999 | Wu et al. |
| 6,137,048 A | 10/2000 | Wu et al. |
| 6,169,246 B1 | 1/2001 | Wu et al. |
| 6,221,495 B1 | 4/2001 | Wu et al. |
| 6,423,565 B1 | 7/2002 | Barth et al. |
| 6,444,043 B1 | 9/2002 | Gegenwart et al. |
| 6,548,751 B2 | 4/2003 | Sverdrup, Jr. et al. |
| 6,852,614 B1 | 2/2005 | Compaan et al. |
| 6,913,943 B2 | 7/2005 | Cunningham et al. |
| 7,141,863 B1 | 11/2006 | Compaan et al. |
| 7,211,462 B2 | 5/2007 | Romeo et al. |
| 7,522,282 B2 | 4/2009 | Nolte et al. |
| 7,557,053 B2 | 7/2009 | Thomsen et al. |

(Continued)

FOREIGN PATENT DOCUMENTS

EP 2034002 3/2009

(Continued)

OTHER PUBLICATIONS

Citation of Related Applications.

(Continued)

*Primary Examiner* — Matthew W Such
*Assistant Examiner* — Scott Stowe
(74) *Attorney, Agent, or Firm* — Dority & Manning, P.A.

(57) ABSTRACT

Thin film photovoltaic devices are provided that generally include a transparent conductive oxide layer on the glass, a multi-layer n-type stack on the transparent conductive oxide layer, and an absorber layer (e.g., a cadmium telluride layer) on the multi-layer n-type stack. The multi-layer n-type stack generally includes a first layer (e.g., a cadmium sulfide layer) and a second layer (e.g., a mixed phase layer). The multi-layer n-type stack can, in certain embodiments, include additional layers (e.g., a third layer, a fourth layer, etc.). Methods are also generally provided for manufacturing such thin film photovoltaic devices.

20 Claims, 6 Drawing Sheets

U.S. PATENT DOCUMENTS

| | | |
|---|---|---|
| 7,659,968 B2 | 2/2010 | Wang et al. |
| 7,663,092 B2 | 2/2010 | Nolte et al. |
| 2004/0063320 A1 | 4/2004 | Hollars |
| 2005/0009228 A1* | 1/2005 | Wu et al. ................. 438/95 |
| 2007/0209698 A1 | 9/2007 | Thomsen et al. |
| 2008/0096376 A1 | 4/2008 | Li et al. |
| 2009/0165839 A1 | 7/2009 | Zeman et al. |
| 2009/0194165 A1 | 8/2009 | Murphy et al. |
| 2009/0217978 A1 | 9/2009 | Thomsen et al. |
| 2009/0242029 A1 | 10/2009 | Paulson et al. |
| 2011/0005594 A1 | 1/2011 | Powell et al. |
| 2011/0100460 A1 | 5/2011 | Bryden et al. |
| 2011/0269261 A1 | 11/2011 | Drayton et al. |
| 2012/0024692 A1* | 2/2012 | Feldman-Peabody et al. ................ 204/192.1 |

FOREIGN PATENT DOCUMENTS

| | | |
|---|---|---|
| EP | 2110904 | 10/2009 |
| JP | 57045288 A2 | 3/1982 |
| WO | 9847702 A1 | 10/1998 |
| WO | 2005117139 A1 | 12/2005 |

OTHER PUBLICATIONS

Wu, Xuanzhi. "High-efficiency polycrystalline CdTe thin-film solar cells", *Solar Energy* 77, pp. 803-814, 2004.

Gupta, Akhlesh. "Oxygentated CdS Window Layer for Sputtered CdS/CdTe Solar Cells", *MRS Symposium Proceedings*, vol. 763. B8.9.1-B8.9.6, 2003.

* cited by examiner

MULTI-LAYER N-TYPE STACK FOR CADMIUM TELLURIDE BASED THIN FILM PHOTOVOLTAIC DEVICES AND METHODS OF MAKING

FIELD OF THE INVENTION

The subject matter disclosed herein relates generally to a multi-layer n-type stack for use in a photovoltaic device, along with their methods of deposition. More particularly, the subject matter disclosed herein relates to a multi-layer n-type stack including a combination of cadmium, sulfur, and/or oxygen for use in cadmium telluride thin film photovoltaic devices and their methods of manufacture.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials.

The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., an electron accepting layer) and the CdS layer acts as an n-type layer (i.e., an electron donating layer). Free carrier pairs are created by light energy and then separated by the p-n heterojunction to produce an electrical current.

Higher performance has been seen in such modules when using a cadmium sulfide layer sputtered in the presence of oxygen. This oxygen in the deposition process correlates to oxygen being included in the cadmium sulfide thin film layer, in the form of a random mixture of compounds that include CdS, CdO, $CdSO_3$, and $CdSO_4$. However, the exact stoichiometry of the deposited layer cannot be controlled in this reactive sputtering process.

Thus, a need exists for controlling the oxygen content and stoichiometry of the cadmium, sulfur, and oxygen forming the n-type window layer for use in a cadmium telluride based thin film PV device.

BRIEF DESCRIPTION OF THE INVENTION

Aspects and advantages of the invention will be set forth in part in the following description, or may be obvious from the description, or may be learned through practice of the invention.

Thin film photovoltaic devices are provided that generally include a transparent conductive oxide layer on the glass, a multi-layer n-type stack on the transparent conductive oxide layer, and a cadmium telluride layer on the multi-layer n-type stack. The multi-layer n-type stack generally includes a first layer (e.g., a cadmium sulfide layer) and a second layer (e.g., a mixed phase layer). The multi-layer n-type stack can, in certain embodiments, include additional layers (e.g., a third layer, a fourth layer, etc.).

Methods are also generally provided for manufacturing such thin film photovoltaic devices.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
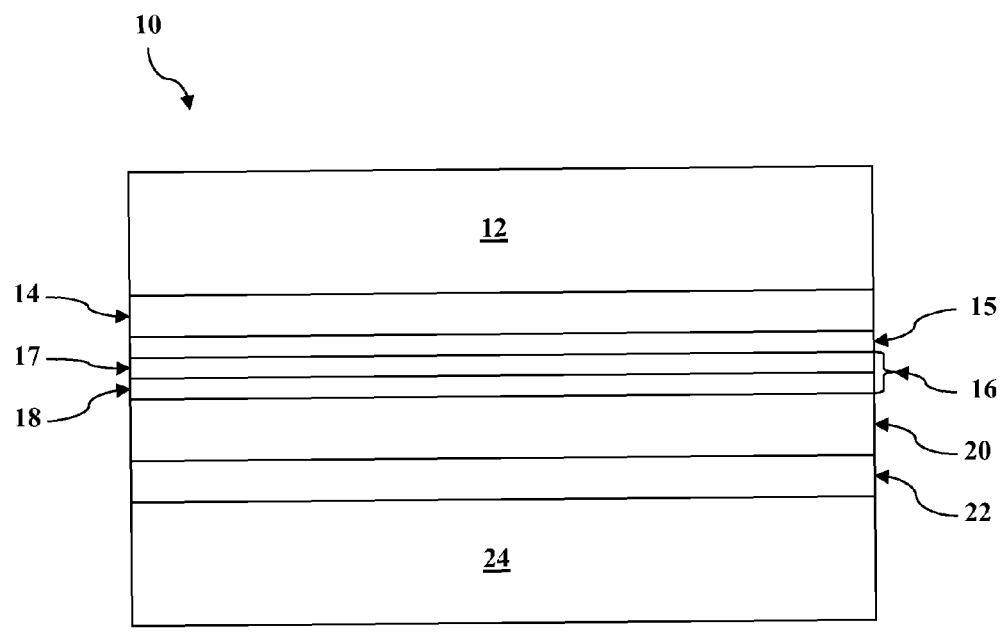
FIGS. 1 and 2 show exemplary cadmium telluride based thin film photovoltaic devices including a multi-layer n-type stack having two layers.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers, unless expressly stated to the contrary. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Cadmium telluride based thin film photovoltaic devices are generally disclosed having a multi-layer window stack that collectively forms the n-type layer of the device, along with their methods of manufacture. Through the use of the multi-layer n-type stack, the stoichiometry of the n-type layer (commonly referred to the cadmium sulfide layer in a typical cadmium telluride based thin film photovoltaic device) can be controlled. For example, the multi-layer n-type stack can have two or more layers (e.g., two layers, three layers, four layers, etc.). In particular embodiments, two, three, or four layers can form the multi-layer n-type stack. Thus, the properties and characteristics of the n-type region can be tailored during manufacturing to form the desired device.

FIGS. 1-8 each show various embodiments of a PV device 10 that generally includes a top sheet of glass 12 employed as the substrate, a transparent conductive oxide (TCO) layer 14, an optional resistive transparent buffer (RTB) layer 15, a multi-layer n-type stack 16, a cadmium telluride layer 20 (acting as an absorber layer), a back contact 22, and an encapsulating glass 24. Each of these layers will be discussed in greater detail below.

Figure 2:
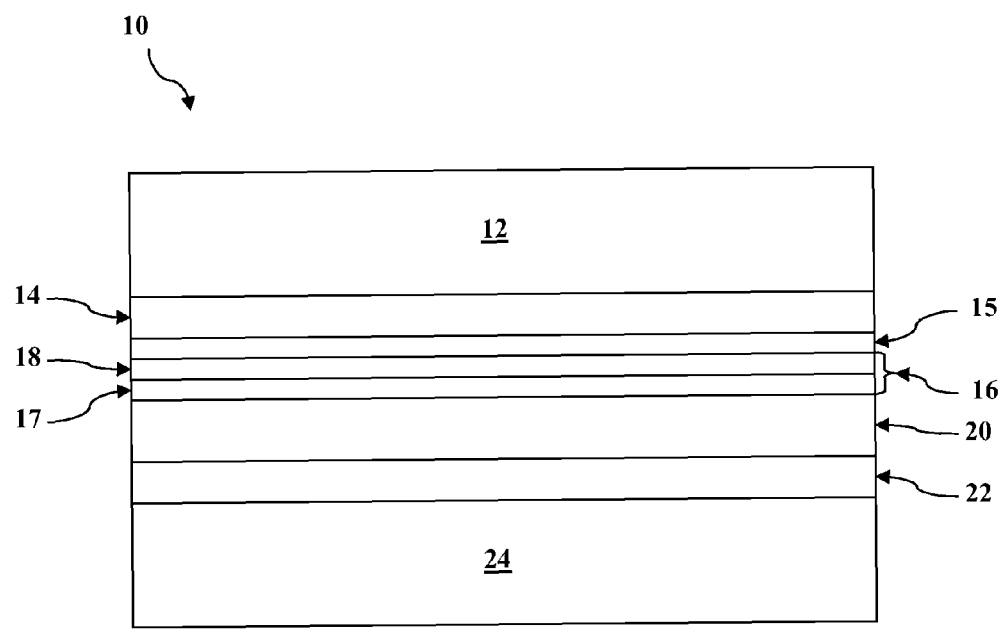

FIGS. 1 and 2 show exemplary devices 10 that include a multi-layer n-type stack 16 formed from two layers: a first layer 17 and a second layer 18. As shown, the multi-layer n-type stack 16 is on the TCO layer 14, with the optional RTB layer 15 positioned therebetween. In the embodiment of FIG. 1, the first layer 17 is positioned between the TCO layer 14 and the second layer 18. In the alternative embodiment of FIG. 2, the second layer 18 is positioned between the TCO layer 14 and the first layer 17. Thus, both layers can be referred to as being on the TCO layer 14 (and on the RTB layer 15, if present) in the embodiments shown in FIGS. 1 and 2, no matter the particular order of the first layer 17 and the second layer 18.

The first layer 17 generally includes cadmium and sulfur. For example, the first layer 17 can be a cadmium sulfide layer that generally includes cadmium sulfide (CdS) but may also include other compounds and materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer can have a wide band gap (e.g., from about 2.25 eV to about 3.0 eV, such as about 2.4-2.5 eV) in order to allow most radiation energy (e.g., solar radiation) to pass.

Without wishing to be bound to any particular theory, it is believed that the CdS layer serves a "junction partner" to the CdTe, increasing the open circuit voltage of the solar cell perhaps by decreasing recombination on the surface of the CdTe. A minimum amount of CdS is required to form a continuous layer on the sometimes rough surface defined by the TCO. In this way, a thicker CdS film can lead to higher efficiencies through higher voltage. At the same time, the CdS is not effective at collecting electron-hole pairs, and can diminish short circuit current. Thus, a thicker CdS layer can eventually reduce efficiency through decreasing current. By having a multi-layered stack of CdS and another material that is more transparent, both high voltage and current can be obtained simultaneously.

The cadmium sulfide layer can be formed by sputtering, chemical vapor deposition, chemical bath deposition, and other suitable deposition methods. In one particular embodiment, the cadmium sulfide layer can be formed by sputtering (e.g., direct current (DC) sputtering or radio frequency (RF) sputtering). Sputtering deposition generally involves ejecting material from a target, which is the material source, and depositing the ejected material onto the substrate to form the film. DC sputtering (including pulsed DC sputtering) generally involves applying a current to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. The current applied to the source material can vary depending on the size of the source material, size of the sputtering chamber, amount of surface area of substrate, and other variables. In some embodiments, the current applied can be from about 2 amps to about 20 amps. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

The second layer 18 generally includes cadmium, oxide, and sulfur in the form of mixed compounds (i.e., a mixed phase layer). Thus, the second layer 18 can be a mixed phase layer that includes cadmium, oxygen, and sulfur as a mixture of compounds. For example, the second layer 18 may include at least two of cadmium oxide (CdO), cadmium sulfide (CdS), CdSO$_x$ where x is 3 or 4, or any combination thereof. For example, the second layer may include at least two of cadmium oxide, cadmium sulfide, cadmium sulfite, or cadmium sulfate. In one particular embodiment, the second layer 18 may include at least three of cadmium oxide, cadmium sulfide, cadmium sulfite, or cadmium sulfate. For instance, the second layer 18 may include a mixture of cadmium oxide, cadmium sulfide, cadmium sulfite, and cadmium sulfate.

The inclusion of oxygen in at least one of the layers of the multi-layer n-type stack 16 can cause the optical bandgap to shift to include higher energy radiation (such as blue and ultraviolet radiation). Thus, the multi-layer n-type stack 16 may allow more light to enter the cadmium telluride layer 20 for conversion to electrical current, resulting in a more efficient photovoltaic device 10. Additionally, the inclusion of oxygen in the target, instead of relying on the inclusion of oxygen in the sputtering atmosphere, can provide better stoichiometric control of oxygen in the deposited multi-layer n-type stack 16. Additionally, the use of a multi-layer n-type stack 16 can form substantially uniform layers including oxygen throughout the manufacturing process without relying on complex gas mixing schemes.

Forming a mixed phase layer can be achieved via sputtering a mixed target containing substantially the same materials as deposited or multiple targets in a co-sputtering technique. Other types of deposition include, but are not limited to, co-evaporation and chemical vapor deposition.

FIGS. 3 through 8 show exemplary devices 10 that include a multi-layer n-type stack 16 formed from three layers: a first layer 17, a second layer 18, and a third layer 19. As shown, the multi-layer n-type stack 16 is on the TCO layer 14, with the optional RTB layer 15 positioned therebetween. Thus, all three layers can be referred to as on the TCO layer 14 (and on the RTB layer 15, if present) in the embodiments shown in FIGS. 3-8, no matter the particular order of the first layer 17, the second layer 18, and the third layer 19.

Figure 3:
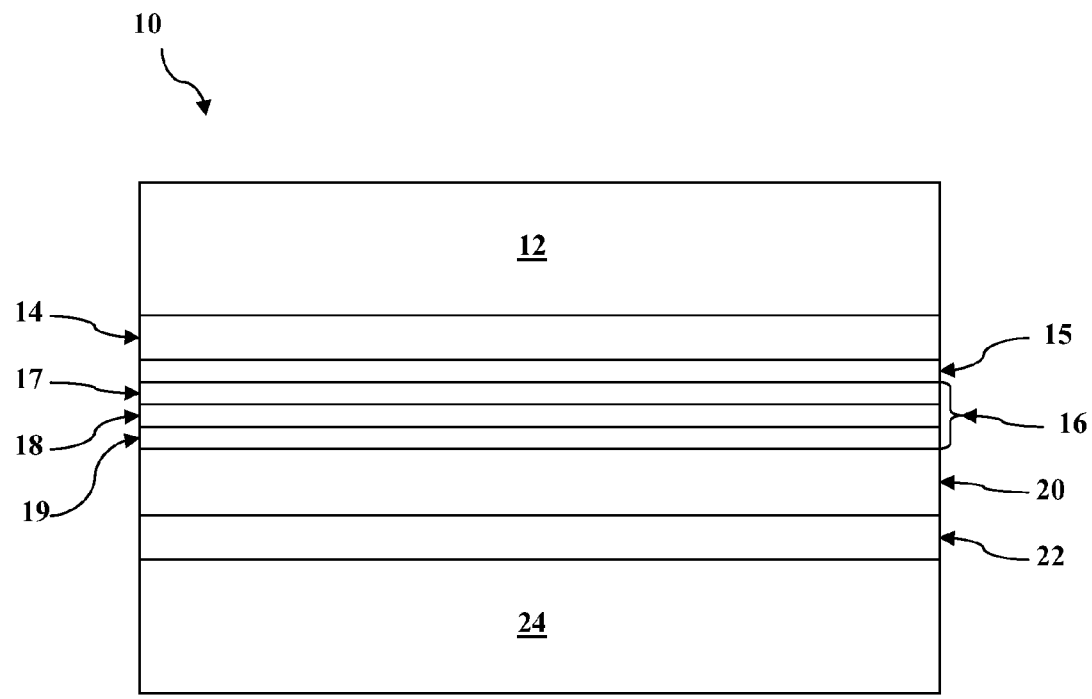
FIGS. 3 through 8 show exemplary cadmium telluride based thin film photovoltaic devices including a multi-layer n-type stack having three layers.
Figure 4:
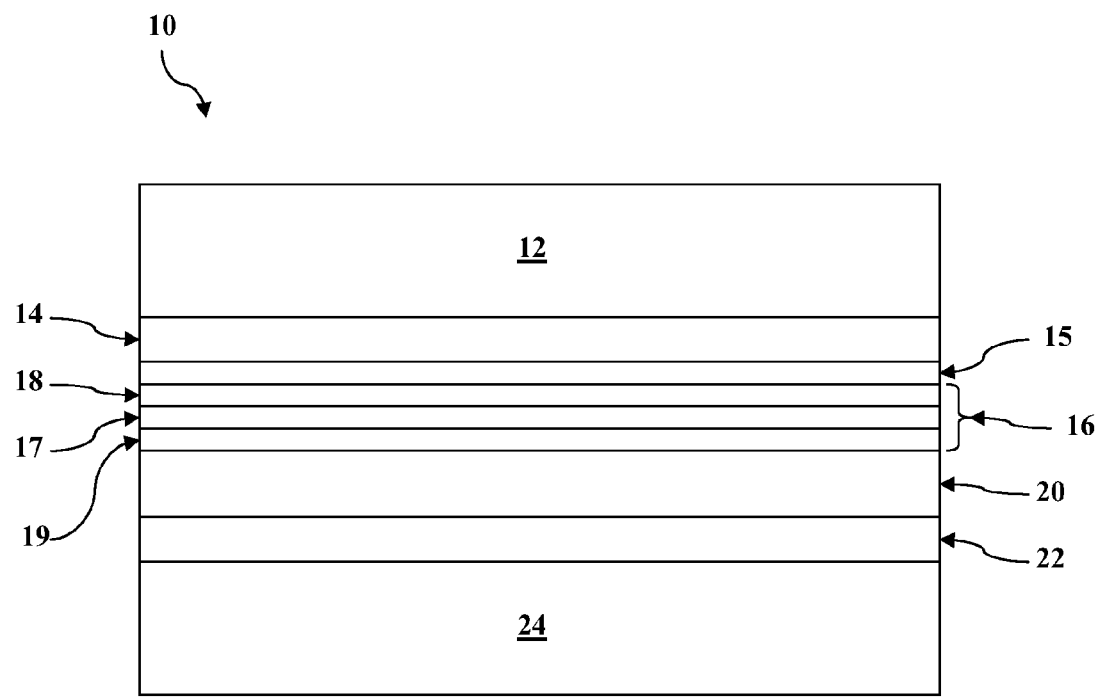
Figure 5:
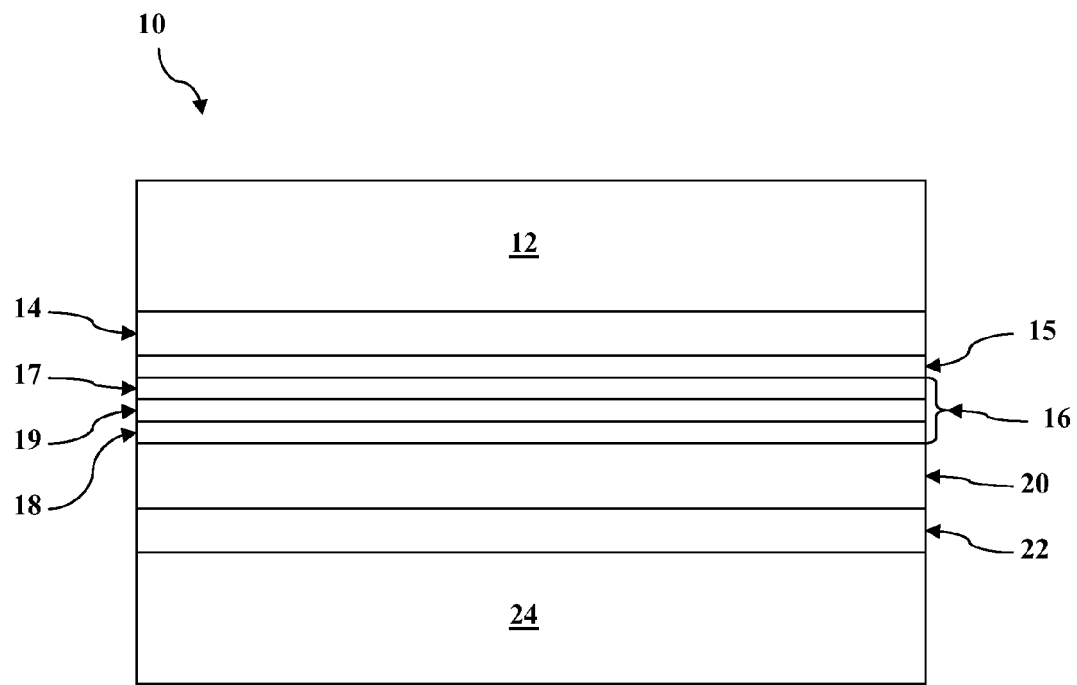
Figure 6:
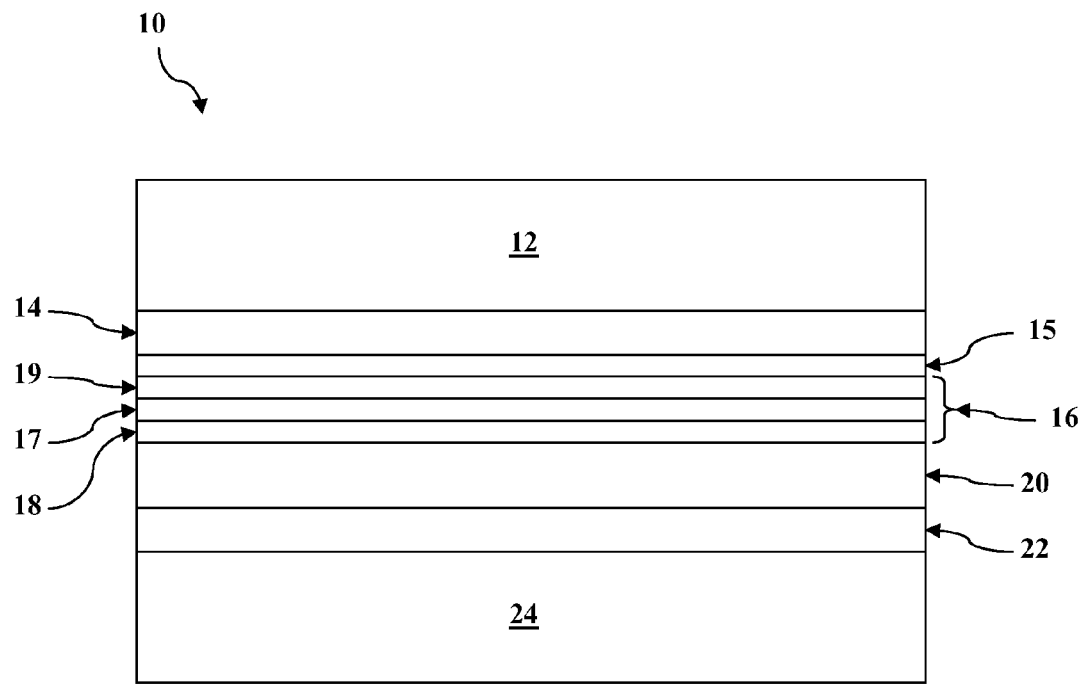
Figure 7:
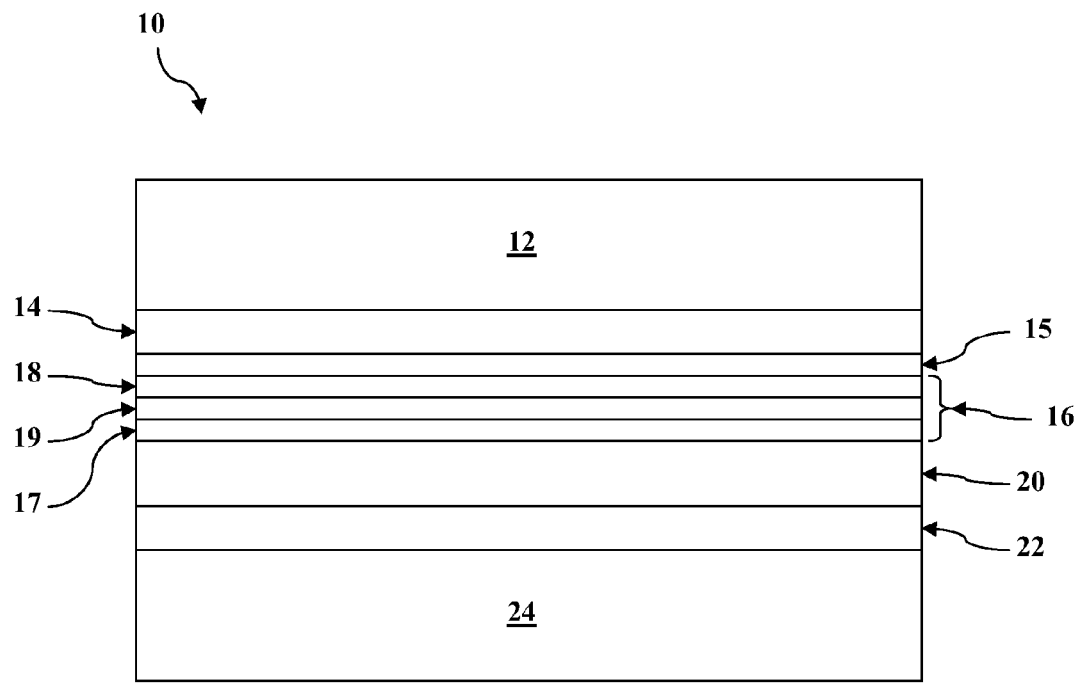
Figure 8:
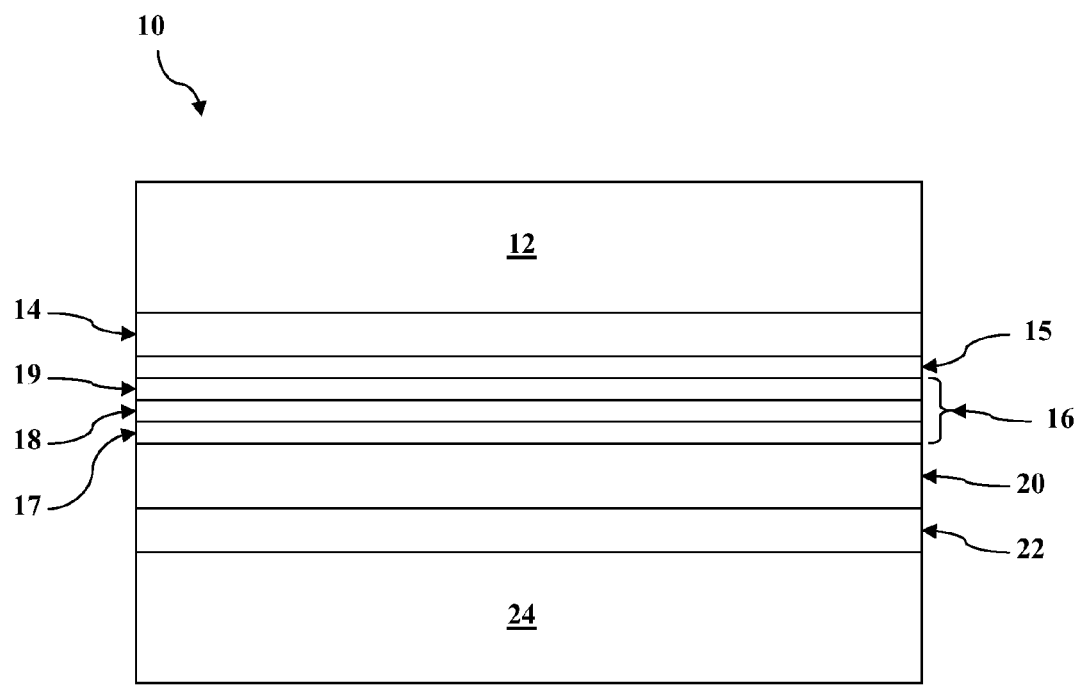

In the embodiment shown in FIG. 3, the first layer 17 is positioned between the TCO layer 14 and the second layer 18, and the second layer 18 is positioned between the first layer 17 and the third layer 19. In an alternative embodiment shown in FIG. 4, the second layer 18 is positioned between the TCO layer 14 and the first layer 17, and the first layer 17 is positioned between the second layer 18 and the third layer 19. In the embodiment shown in FIG. 5, the first layer 17 is positioned between the TCO layer 14 and the third layer 19, and the third layer 19 is positioned between the first layer 17 and the second layer 18. In the embodiment shown in FIG. 6, the third layer 19 is positioned between the TCO layer 14 and the first layer 17, and the first layer 17 is positioned between the third layer 19 and the second layer 18. In the embodiment shown in FIG. 7, the second layer 18 is positioned between the TCO layer 14 and the third layer 19, and the third layer 19 is positioned between the second layer 18 and the first layer 17. In the embodiment shown in FIG. 8, the third layer 19 is positioned between the TCO layer 14 and the second layer 18, and the second layer 18 is positioned between the third layer 19 and the first layer 17.

The first layer 17 and the second layer 18 can be substantially the same as described above. The third layer 19 can generally include cadmium and oxygen. For example, the third layer 19 can be a cadmium oxide layer that generally includes cadmium oxide (CdO) but may also include other compounds and materials, such as dopants and other impurities. When including cadmium oxide, the third layer 19 can be formed via sputtering a target that includes cadmium oxide.

In certain embodiments, the third layer 19 can further include sulfur in addition to cadmium and oxygen. Such a layer can be formed, in one embodiment, through sputtering a mixed target that generally includes cadmium, sulfur, and oxygen. In particular, the mixed target can include a blend of cadmium sulfide (CdS) and cadmium oxide (CdO). For example, the mixed target can be formed by blending powdered cadmium sulfide and powdered cadmium oxide and pressing the blended powders into a target. In one embodiment, the blended powders can be heated to react the cadmium sulfide and cadmium oxide into a ternary compound (e.g., $CdS_{1-x}O_x$, where x is the desired molar percent of oxygen in the layer, such as about 0.005 to about 0.25 as discussed below). For example, the mixed target can include about 0.5 molar % to about 25 molar % of cadmium oxide, such as about 1 molar % to about 20 molar % of cadmium oxide, or about 5 molar % to about 15 molar %. Conversely, the mixed target can include about 75 molar % to about 99.5 molar % of cadmium sulfide, such as about 80 molar % to about 99 molar % of cadmium sulfide, or about 85 molar % to about 95 molar %.

In one particular embodiment, the third layer 19 can include a compound of the formula: $CdSO_x$, where x is 3 or 4. As such, the third layer 19 can be a cadmium sulfite layer that generally includes cadmium sulfite ($CdSO_3$) but may also include other compounds and materials, such as dopants and other impurities. Alternatively, the third layer 19 can be a cadmium sulfate layer that generally includes cadmium sulfate ($CdSO_4$) but may also include other compounds and materials, such as dopants and other impurities. Such a layer can be formed via sputtering a target having the desired composition.

Thus, the third layer 19 can be a cadmium oxide layer, a cadmium sulfite layer, a cadmium sulfate layer, or a mixed phase layer that includes cadmium, oxygen, and sulfur as a mixture of compounds. For example, the third layer 19 may include at least two of cadmium oxide, cadmium sulfide, cadmium sulfite, or cadmium sulfate. In one particular embodiment, the third layer 19 may include at least three of cadmium oxide, cadmium sulfide, cadmium sulfite, or cadmium sulfate. For instance, the third layer 19 may include a mixture of cadmium oxide, cadmium sulfide, cadmium sulfite, and cadmium sulfate.

The third layer 19 can, in one embodiment, have a different combination of compounds than the second layer 18. For example, the third layer 19 can be formed independently from the same materials as discussed above with respect to the second layer 18, or a mixture thereof.

Figure 9:
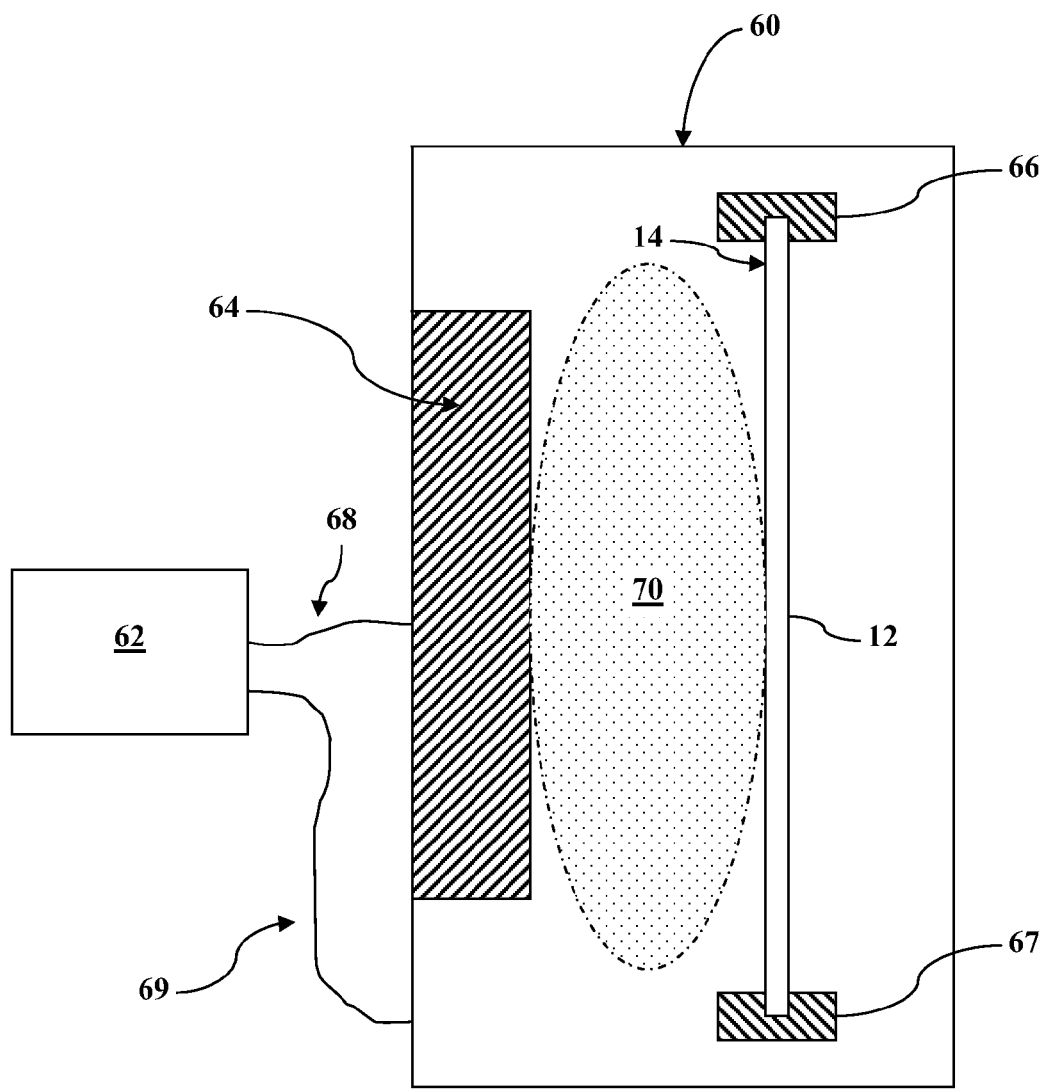
FIG. 9 shows a general schematic of a cross-sectional view of an exemplary DC sputtering chamber according to one embodiment of the present invention; and, FIG. 10 shows a diagram of an exemplary method of making cadmium telluride based thin film photovoltaic devices including a multi-layer n-type stack.

As stated, the layers 17, 18, and the optional third layer 19 can be sputtered onto the TCO layer 14. FIG. 9 shows a general schematic as a cross-sectional view of an exemplary DC sputtering chamber 60 for sputtering any layer in the device 10. A DC power source 62 is configured to control and supply DC power to the chamber 60. As shown, the DC power source applies a voltage to the cathode 64 to create a voltage potential between the cathode 64 and an anode formed by the chamber wall, such that the substrate is in between the cathode and anode. The glass substrate 12 is held between a top support 66 and a bottom support 67 via wires 68 and 69, respectively. Generally, the glass substrate 12 is positioned within the sputtering chamber 60 such that the sputtered layer (e.g., of the multi-layer n-type stack 16) is formed on the surface facing the cathode 64, and generally on the TCO layer 14 and RTB layer 15 (not shown) as discussed below.

A plasma field 70 is created once the sputtering atmosphere is ignited, and the plasma is sustained in response to the voltage potential between the cathode 64 and the chamber wall acting as an anode. The voltage potential causes the plasma ions within the plasma field 70 to accelerate toward the cathode 64, causing atoms from the cathode 64 to be ejected toward the surface on the glass substrate 12. As such, the cathode 64 can be referred to as a "target" and acts as the source material for the formation of the sputtered layer on the surface of the glass substrate 12 facing the cathode 64.

Although only a single DC power source 62 is shown, the voltage potential can be realized through the use of multiple power sources coupled together. Additionally, the exemplary sputtering chamber 60 is shown having a vertical orientation, although any other configuration can be utilized. After exiting the sputtering chamber 60, the substrate 12 can enter an adjacent annealing oven (not shown) to begin the annealing process.

In the embodiments shown in FIGS. 1-8, the glass 12 can be referred to as a "superstrate", as it is the substrate on which the subsequent layers are formed even though it faces upward to the radiation source (e.g., the sun) when the photovoltaic device 10 is in used. The top sheet of glass 12 can be a high-transmission glass (e.g., high transmission borosilicate glass), low-iron float glass, standard soda-lime float glass, or another highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.15% by weight iron (Fe), and may have a transmissiveness of about 0.9 or greater in the spectrum of interest (e.g., wavelengths from about 300 nm to about 900 nm).

The TCO layer 14 is shown on the glass 12 of the exemplary device 10. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, indium tin oxide, zinc stannate, cadmium stannate, or mixtures thereof. Additionally, the TCO layer 14 can include other conductive, transparent materials. The TCO layer 14 can also include dopants (e.g., fluorine, tin, etc.) and other materials, as desired.

The TCO layer 14 can be formed by sputtering, chemical vapor deposition, spray pyrolysis, or any other suitable deposition method. In one particular embodiment, the TCO layer 14 can be formed by sputtering (e.g., DC sputtering or RF sputtering) on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis. In certain embodiments, the TCO layer 14 can have a thickness between about 0.1 µm and about 1 µm, for example from about 0.1 µm to about 0.5 µm, such as from about 0.25 µm to about 0.35 µm.

A resistive transparent buffer layer 15 (RTB layer) is shown on the TCO layer 14 on the exemplary photovoltaic devices 10. The RTB layer 15 is generally more resistive than the TCO layer 14 and can help protect the device 10 from chemical interactions between the TCO layer 14 and the subsequent layers during processing of the device 10. For example, in certain embodiments, the RTB layer 15 can have a sheet resistance that is greater than about 1000 ohms per square, such as from about 10 kOhms per square to about 1000 MOhms per square. The RTB layer 15 can also have a wide optical bandgap (e.g., greater than about 2.5 eV, such as from about 2.7 eV to about 3.5 eV).

Without wishing to be bound by a particular theory, it is believed that the presence of the RTB layer 15 between the TCO layer 14 and the multi-layer n-type stack 16 can allow for a relatively thin multi-layer n-type stack 16 to be included in the device 10 by reducing the possibility of interface defects (i.e., "pinholes" in the multi-layer n-type stack 16) creating shunts between the TCO layer 14 and the cadmium telluride layer 20. Thus, it is believed that the RTB layer 15 allows for improved adhesion and/or interaction between the TCO layer 14 and the cadmium telluride layer 20, thereby allowing a relatively thin multi-layer n-type stack 16 to be formed thereon without significant adverse effects that would otherwise result from such a relatively thin multi-layer n-type stack 16 formed directly on the TCO layer 14.

The RTB layer 15 can include, for instance, a combination of zinc oxide (ZnO) and tin oxide ($SnO_2$), which can be referred to as a zinc tin oxide layer ("ZTO"). In one particular embodiment, the RTB layer 15 can include more tin oxide than zinc oxide. For example, the RTB layer 15 can have a composition with a stoichiometric ratio of $ZnO/SnO_2$ between about 0.25 and about 3, such as in about a one to two (1:2) stoichiometric ratio of tin oxide to zinc oxide. The RTB layer 15 can be formed by sputtering, chemical vapor deposition, spray-pyrolysis, or any other suitable deposition method. In one particular embodiment, the RTB layer 15 can be formed by sputtering (e.g., DC sputtering or RF sputtering) on the TCO layer 14. For example, the RTB layer 15 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 15 can have a thickness between about 0.075 µm and about 1 µm, for example from about 0.1 µm to about 0.5 µm. In particular embodiments, the RTB layer 15 can have a thickness between about 0.08 µm and about 0.2 µm, for example from about 0.1 µm to about 0.15 µm.

Due to the presence of the RTB layer 15, the multi-layer n-type stack 16 can have a thickness that is less than about 0.1 µm, such as between about 10 nm and about 100 nm, such as from about 50 nm to about 80 nm, with a minimal presence of pinholes between the TCO layer 14 and the multi-layer n-type stack 16. Additionally, a multi-layer n-type stack 16 having a thickness less than about 0.1 µm reduces any absorption of radiation energy by the multi-layer n-type stack 16, effectively increasing the amount of radiation energy reaching the underlying cadmium telluride layer 20.

A cadmium telluride layer 20 is shown on the multi-layer n-type stack 16 in the exemplary devices 10. The cadmium telluride layer 20 is a p-type layer that generally includes cadmium telluride (CdTe) but may also include other materials. As the p-type layer of device 10, the cadmium telluride layer 20 is the photovoltaic layer that interacts with the multi-layer n-type stack 16 (i.e., the n-type layer) to produce current from the adsorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the multi-layer n-type stack 16) and, conversely, holes may pass from the n-type side to the p-type side. Thus, the p-n junction formed between the multi-layer n-type stack 16 and the cadmium telluride layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In one particular embodiment, the multi-layer n-type stack 16 is deposited by a sputtering and the cadmium telluride layer 20 is deposited by close-space sublimation. In particular embodiments, the cadmium telluride layer 20 can have a thickness between about 0.1 µm and about 10 µm, such as from about 1 µm and about 5 µm. In one particular embodiment, the cadmium telluride layer 20 can have a thickness between about 1.5 µm and about 4 µm, such as about 2 µm to about 3 µm.

A series of post-forming treatments can be applied to the exposed surface of the cadmium telluride layer 20. These treatments can tailor the functionality of the cadmium telluride layer 20 and prepare its surface for subsequent adhesion to the back contact layer(s) 22. For example, the cadmium telluride layer 20 can be annealed at elevated temperatures (e.g., from about 350° C. to about 500° C., such as from about 375° C. to about 425° C.) for a sufficient time (e.g., from about 1 to about 40 minutes) to create a quality p-type layer of cadmium telluride. Without wishing to be bound by theory, it is believed that annealing the cadmium telluride layer 20 (and the device 10) decreases the deep-defect density and makes the CdTe layer more p-type. Additionally, the cadmium telluride layer 20 can recrystallize and undergo grain regrowth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as CdO, $CdTeO_3$, $CdTe_2O_5$, etc. For instance, the surface can be washed with a suitable solvent (e.g., ethylenediamine, also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22 and/or can create a Cu-doped CdTe layer. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 250° C.) for about 5 minutes to about 30 minutes, such as from about 10 to about 25 minutes.

A back contact layer 22 is shown on the cadmium telluride layer 20. The back contact layer 22 generally serves as the back electrical contact, in relation to the opposite, TCO layer 14 serving as the front electrical contact. The back contact layer 22 can be formed on, and in one embodiment is in direct contact with, the cadmium telluride layer 20. The back contact layer 22 is suitably made from one or more highly conductive materials, such as elemental nickel, chromium, copper, tin, silver, or alloys or mixtures thereof. Additionally, the back contact layer 22 can be a single layer or can be a plurality of layers. In one particular embodiment, the back contact layer 22 can include graphite, such as a layer of carbon deposited on the p-layer followed by one or more layers of metal, such as the metals described above. The back contact layer 22, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 µm to about 10 µm in thickness, for example from about 1 µm to about 5 µm. A metal layer of the back contact, if used for or as part of the back contact layer 22, can be from about 0.1 µm to about 1.5 µm in thickness.

The encapsulating glass 24 is also shown in the exemplary cadmium telluride thin film photovoltaic device 10 of FIG. 1.

Other components (not shown) can be included in the exemplary device 10, such as buss bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

Figure 10:
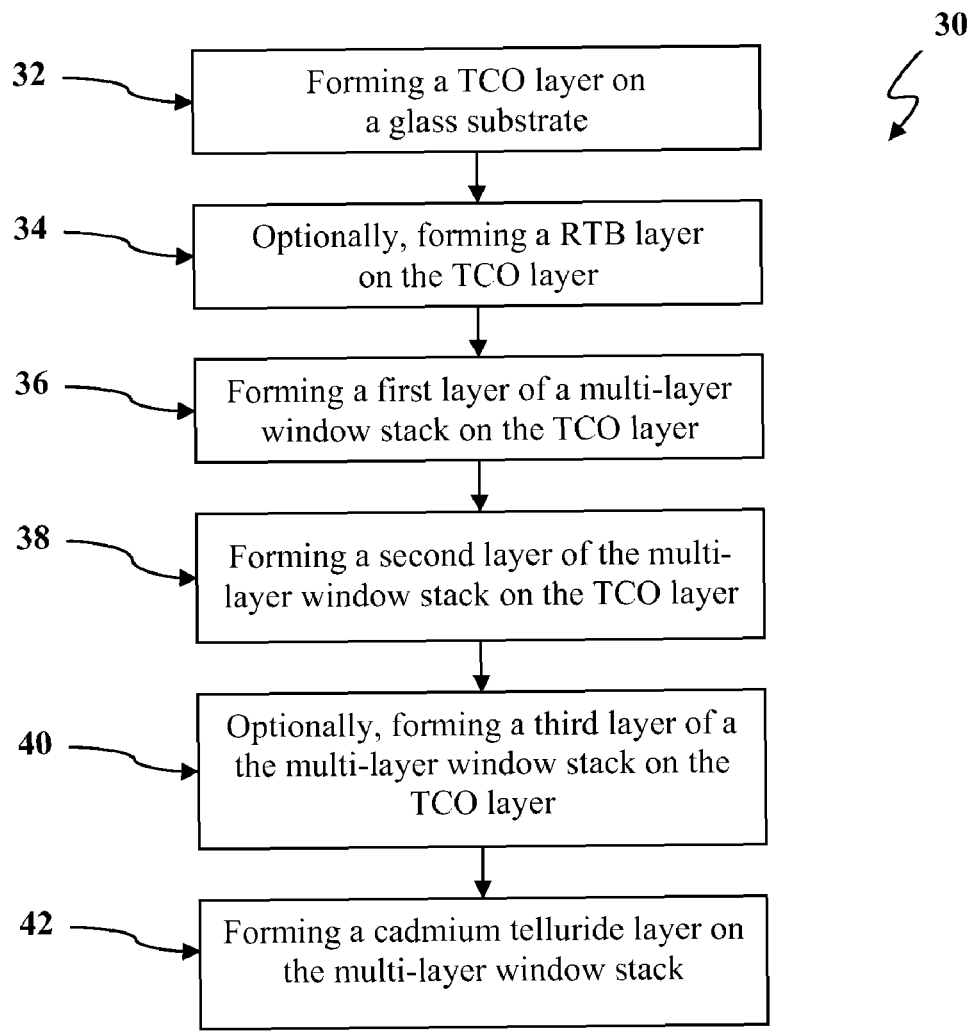

FIG. 10 shows a flow diagram of an exemplary method 30 of manufacturing a photovoltaic device according to one embodiment of the present invention. According to the exemplary method 30, a TCO layer is formed on a glass superstrate at 32. At 34, a RTB layer is optionally formed on the TCO layer. A first layer of a multi-layer n-type stack is formed on the TCO layer at 36, and a second layer of a multi-layer n-type stack is formed on the TCO layer at 38. Optionally, a third layer of a multi-layer n-type stack is formed on the TCO layer at 40. A cadmium telluride layer is formed on the multi-layer n-type stack at 42.

One of ordinary skill in the art should recognize that other processing and/or treatments can be included in the method 30. For instance, when including a cadmium sulfide layer and a cadmium telluride layer, the cadmium telluride layer can be annealed in the presence of cadmium chloride, washed to remove any CdO formed on the surface, and doped with copper. Back contact layer(s) can be applied over the cadmium telluride layer, and an encapsulating glass can be applied over the back contact layer. Additionally, the method may also include laser scribing to form electrically isolated photovoltaic cells in the device. These electrically isolated photovoltaic cells can then be connected in series to form a photovoltaic module. Also, electrical wires can be connected to positive and negative terminals of the photovoltaic module to provide lead wires to harness electrical current produced by the photovoltaic module.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A thin film photovoltaic device, comprising:
a glass;
a transparent conductive oxide layer on the glass;
a mixed phase layer on the transparent conductive oxide layer, wherein the mixed phase layer comprises cadmium, sulfur, and oxygen in a mixture of compounds;
a cadmium sulfide layer on the transparent conductive oxide layer; and,
an absorber layer on the cadmium sulfide layer.

2. The device of claim 1, wherein the absorber layer comprises cadmium telluride.

3. The device of claim 1, wherein the mixed phase layer comprises at least two of cadmium oxide, cadmium sulfide, cadmium sulfate, and cadmium sulfite.

4. The device of claim 1, wherein the mixed phase layer comprises at least three of cadmium oxide, cadmium sulfide, cadmium sulfate, and cadmium sulfite.

5. The device of claim 1, wherein the mixed phase layer comprises cadmium oxide, cadmium sulfide, cadmium sulfate, and cadmium sulfite.

6. The device of claim 1, wherein the mixed phase layer is positioned between the transparent conductive oxide layer and the cadmium sulfide layer.

7. The device of claim 1, wherein the cadmium sulfide layer is positioned between the transparent conductive oxide layer and the mixed phase layer.

8. The device of claim 1, further comprising:
a cadmium oxide layer positioned between the transparent conductive oxide layer and the absorber layer.

9. The device of claim 1, further comprising:
a cadmium-sulfur-oxide layer positioned between the transparent conductive oxide layer and the absorber layer, wherein the cadmium-sulfur-oxide layer comprises CdSOx, where x is 3 or 4.

10. The device of claim 1, wherein the cadmium sulfide layer forms a first layer of a multi-layer n-type stack and the mixed phase layer forms a second layer of the multi-layer n-type stack, and wherein the multi-layer n-type stack further comprises a third layer, the third layer comprising cadmium and oxygen.

11. The device of claim 10, wherein the third layer further comprises sulfur.

12. The device of claim 1, wherein the cadmium sulfide layer comprises oxygen in an amount of about 0.1% by weight to about 25% by weight.

13. The device of claim 1, further comprising:
a resistive transparent buffer layer directly on the transparent conductive oxide layer such that the cadmium sulfide layer and the mixed phase layer are on the resistive transparent buffer layer.

14. A method of forming a thin film photovoltaic device, the method comprising:
depositing a mixed phase layer on a transparent conductive oxide layer, wherein the transparent conductive oxide layer is on a glass substrate, and wherein the mixed phase layer comprises cadmium, sulfur, and oxygen;
depositing a cadmium sulfide layer on the transparent conductive oxide layer; and,
depositing an absorber layer on the cadmium sulfide layer.

15. The method of claim 14, wherein the mixed phase layer comprises at least two of cadmium sulfide, cadmium oxide, cadmium sulfate, and cadmium sulfite.

16. The method of claim 14, further comprising:
depositing at least one of a cadmium oxide layer or a cadmium-sulfur-oxide layer on the transparent conductive oxide layer.

17. The method of claim 14, wherein depositing the mixed phase layer comprises:
co-sputtering a first target and a second target, wherein the first target and the second target have differing compositions.

18. The method of claim 14, wherein depositing the mixed phase layer comprises:
co-sputtering a first target, a second target, and a third target, wherein the first target, the second target, and the third target have differing compositions.

19. The method of claim 14, wherein depositing the mixed phase layer comprises:
sputtering a mixed target, wherein the mixed target comprises at least two of cadmium sulfide, cadmium oxide, cadmium sulfate, and cadmium sulfite.

20. The method of claim 14, wherein depositing the cadmium sulfide layer comprises:
sputtering a target in a sputtering atmosphere, wherein the target comprises cadmium sulfide.

* * * * *